(12) United States Patent
Park

(10) Patent No.: US 7,530,708 B2
(45) Date of Patent: May 12, 2009

(54) SURFACE EMITTING LIGHT SOURCE AND PROJECTION DISPLAY DEVICE USING THE SAME

(75) Inventor: Chan Young Park, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/242,710

(22) Filed: Oct. 4, 2005

(65) Prior Publication Data

US 2006/0072316 A1  Apr. 6, 2006

(30) Foreign Application Priority Data

Oct. 4, 2004  (KR) .................. 10-2004-0078666

(51) Int. Cl.
*F21V 9/00* (2006.01)
(52) U.S. Cl. .................. 362/231; 362/268; 362/297; 362/800
(58) Field of Classification Search ......... 362/268, 362/555, 297, 230, 231, 237, 241, 243, 245, 362/247, 301, 341, 800
See application file for complete search history.

(56) References Cited

U.S. PATENT DOCUMENTS

| 4,271,408 | A  | * | 6/1981 | Teshima et al. ............... 345/83 |
| 6,481,130 | B1 | * | 11/2002 | Wu ............................ 40/546 |
| 6,680,568 | B2 | * | 1/2004 | Fujiwara et al. ............. 313/501 |
| 6,726,332 | B2 | * | 4/2004 | Cannon et al. ................ 353/33 |
| 6,806,112 | B1 | * | 10/2004 | Horng et al. .................. 438/29 |
| 7,125,120 | B2 | * | 10/2006 | Aruga ......................... 353/20 |
| 2004/0164936 | A1 | * | 8/2004 | Lim ............................ 345/76 |
| 2004/0263802 | A1 | * | 12/2004 | Seki et al. .................... 353/99 |
| 2005/0007390 | A1 | * | 1/2005 | Yoshida et al. ............. 345/690 |
| 2006/0126020 | A1 | * | 6/2006 | Hirata et al. .................. 353/20 |

* cited by examiner

*Primary Examiner*—Bao Q Truong
(74) *Attorney, Agent, or Firm*—Workman Nydegger

(57) ABSTRACT

A surface emitting light source and projection display device using the same are disclosed, by which a highly integrated and/or high-output surface emitting light source are provided in a manner that improves the structure of semiconductor light emitting units. The present invention includes a plurality of semiconductor light emitting units arranged on a single plane, the semiconductor light emitting units emitting lights of at least two different colors, wherein the emitted lights are made to proceed externally within a predetermined angle.

17 Claims, 7 Drawing Sheets

SURFACE EMITTING LIGHT SOURCE AND PROJECTION DISPLAY DEVICE USING THE SAME

This application claims the benefit of the Korean Patent Application No. 10-2004-078666, filed on Oct. 4, 2004, which is hereby incorporated by reference as if fully set forth herein.

BACKGROUND OF THE INVENTION

1. Field of the Invention

The present invention relates to a surface emitting light source and projection display device using the same. Particularly, the present invention relates to the surface emitting light and the projection display device which have semiconductor light emitting units which emit lights having a plurality of colors.

2. Discussion of the Related Art

Currently, a high demand exists for display devices that are capable of producing large, high quality images. Representative examples of display devices capable of producing large images include direct-view type liquid crystal displays (LCD), plasma displays, projectors and the like.

Conventional projection display devices typically filter light having the necessary wavelength with a R(red)/G (green)/B(blue) color wheel filter. Hence, conventional projection display devices typically have poor light efficiency and limited color reproduction. The rotating motion of a color wheel often introduces a noise problem. Furthermore, the wear and tear of a color wheel often limits the duration of use. Finally, since only one-third of incident white light is transmitted, efficiency of light use is also lowered.

Meanwhile, a light emitting diode (LED), which is a device that emits light when electrically biased in the forward direction, requires low power and is widely used when only a small light source is needed, and for display devices. LEDs emit narrow-spectrum light, which provides excellent color reproduction performance. Because LEDs have relatively small power consumption, LEDs are capable of being substituted for the lamp of a conventional projection display device.

As emitting efficiency of LEDs has increased, LEDs are being used in new applications that have previously been reserved for other types of light sources that have traditionally produced higher levels of brightness. However, higher output power is still needed before an LED can reliably be used as the light source of a projection display device. Since it is insufficient for one LED to be used as the light source of the projection display device, several LEDs are often combined for use as a surface emitting light source.

Where several combined LEDs are used as a surface emitting light source, the number of LEDs that may be used is limited because LEDs are large in size in comparison to many display devices, such as a digital micro-mirror device (DMD). Because the number of LEDs that may be included as a surface emitting light source is small, it is difficult to obtain a high level of light output. Moreover, the spacing that necessarily exists between LEDs is typically too wide to provide a uniform distribution of light.

When LEDs are employed for a large-size screen such as an outdoor multi-signboard, or for a large-sized screen that is meant to be viewed from a distance, the LEDs have no problem in displaying an image. On the other hand, when LEDs are used as a light source of a small display device or on a small screen meant to be viewed at a close distance, brightness uniformity of the screen is degraded due to the lack of uniformity of the light distribution. Furthermore, since a drive electrode line needs to be connected to each LED, a connection circuit line becomes complicated.

A single panel type DMD projector using an LED surface emitting light source typically synthesizes R, G and B lights and then separates the synthesized lights. Hence, the related art single panel type DMD projector typically requires a complicated optical system. Specifically, since a cross-sectional area of light increases in proportion to the distance from an LED light source due to a big angle of emission, the accompanying optical system, including a lens, prism, and the like, also usually suffers from increasing size. Consequently, the overall size of the projection system also increases.

SUMMARY OF THE INVENTION

Accordingly, the present invention is directed to a surface emitting light source and projection display device using the same that substantially overcome these and other limitations and disadvantages. The surface emitting light source includes a plurality of semiconductor light emitting units arranged on a single plane. The semiconductor light emitting units emit lights of at least two different colors (i.e., red, green, blue, etc.). The surface emitting light source are configured to emit lights externally within a predetermined angle.

Each of the semiconductor light emitting units may include a transparent substrate, a P-type semiconductor layer, an active layer to emit light, an N-type semiconductor layer, a positive electrode and a negative electrode, a reflecting layer, including an electric signal line, and a reflecting mirror for reflecting the light within the predetermined angle.

The projection display device may also include a light illumination unit for creating a uniform brightness distribution of the light proceeding externally from the surface emitting light source. Furthermore, a color image generating unit may be included within the projection display device for modulating light generated by the light illumination unit to generate a color image. In one embodiment, the modulation is performed by a digital micro-mirror device. Additionally, the color image may be enlarged and projected by an optical projection unit.

Further, the projection display device of the present invention may include an image control unit and a light control unit for controlling and synchronizing the an input image signal with the creation of the color image by the color image generation unit.

Another aspect of the invention includes a rod lens for creating a uniform brightness distribution of the light generated by the surface emitting light source. An illumination lens may collect the light from the rod lens and apply the light to the color image generation unit.

The radiation angle of the light generated by the surface emitting light source may be condensed and reduced by a diffraction lens.

It is to be understood that both the foregoing general description and the following detailed description of the present invention are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Prior to describing the present invention, exemplary configurations of a conventional surface emitting light source and single panel type DMD projector will be described with reference to the attached drawings as follows.

Figure 1:
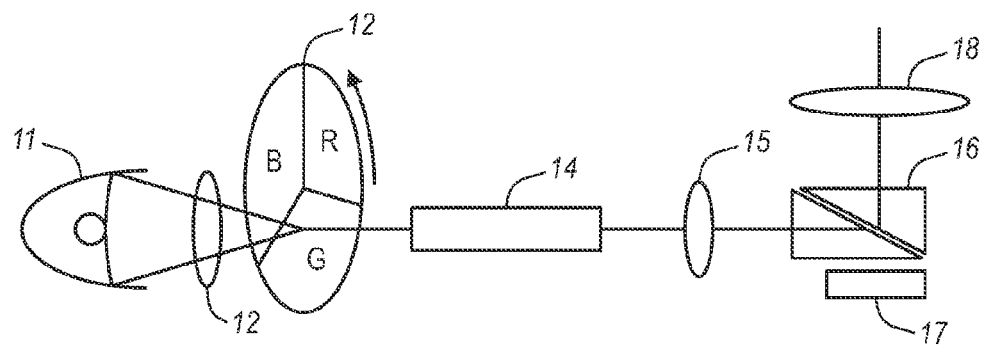
FIG. 1 is a schematic diagram of a conventional single panel type DMD projector.

FIG. 1 is a schematic diagram of a conventional single panel type DMD projector, consisting of a lamp 11, a condenser lens 12, a color wheel 13 for separating incident light coming from the condenser lens 12 into lights having R, G and B colors, a rod lens 14 to create a uniform brightness distribution of light, an illumination lens 15 for condensing the light coming from the rod lens 14, a total internal reflection (TIR) prism 16, and a projection lens 18.

The white light coming from the lamp 11 is condensed by the condenser lens 12 and is then incident on the color wheel 13. The color wheel 13 is configured with a combination of filters transmitting R, G and B lights, respectively. The color wheel 13 rotates at a high rate to sequentially separate the white light into the R, G and B lights. Namely, an R-area of the color wheel 13 transmits red light, a G-area of the color wheel 13 transmits green light, and a B-area of the color wheel 13 transmits blue light. Hence, the white light incident on the color wheel 13 is sequentially transmitted in order of R, G and B colors according to time duration. After the light passes through the color wheel 13, the light becomes incident on the rod lens 14 so that the brightness distribution of the light can be made uniform by the rod lens 14.

The light coming from the rod lens 14 is condensed at a prescribed characteristic angle by the illumination lens 15 and is then incident on the TIR prism 16. The TIR prism 16 includes a pair of prism blocks joined to one another. An air gap is provided to the boundary between the joined prism blocks. Because the light travels from the TIR prism 16, which has a relatively high refraction index, to the air gap, which has a relatively low refraction index, if the angle of incidence of the light is greater than a specific angle, total reflection takes place.

The reflected light from the joined boundary of the TIR prism 16 is applied to the DMD 17. In the present example, the DMD 17 is a reflective display device including a micromirror arranged to configure a pixel. The light applied to the DMD 17 is modulated according to an input image signal applied to the DMD. The modulation generates a reflected light carrying image information, in accordance with conventional DMD technology. The light carrying the image information passes through the TIR prism 16 and the projection lens 18 to be projected to a screen (not shown in the drawing). Hence, a corresponding picture can be implemented thereon.

As described above, the R, G and B lights are sequentially applied to the DMD 17 by the rotation of the color wheel 13. The color signal corresponding to the input image signal applied to the DMD is synchronized with lights produced by the color wheel 13 and applied to the DMD 17. Hence, the DMD 17 implements an accurate color image.

Figure 2A:
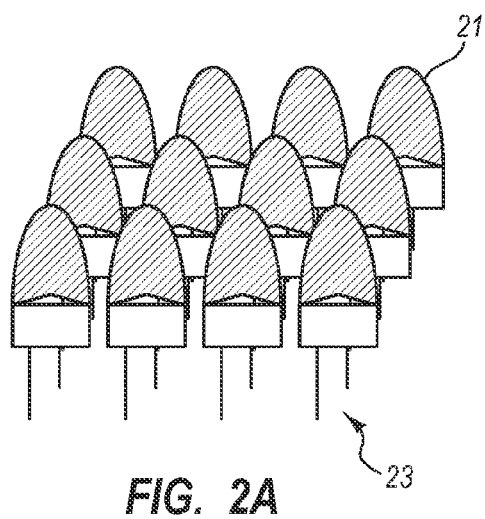
FIG. 2A is a perspective diagram of a surface emitting light source having a plurality of LEDs.
Figure 2B:
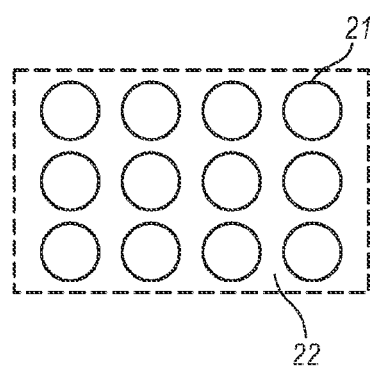
FIG. 2B is a ground diagram of a surface emitting light source having a plurality of LEDs.

FIG. 2A is a perspective diagram of a surface emitting light source having a plurality of LEDs. FIG. 2B is a ground diagram of a surface emitting light source having the plurality of LEDs. In FIG. 2A, reference numbers '21' and '23' indicate an LED and a drive electrode, respectively. In FIG. 2B, a reference number '21' and '22' indicate an LED and an arrangement interval spacing of the LEDs, respectively.

Referring to FIG. 2A and FIG. 2B, a plurality of LEDs are arranged to configure a surface emitting light source. In an ideal setting, the light emitted from each of the LEDs has the appearance of being emitted from one surface emitting light source. Since each of the LEDs included in conventional surface emitting light sources, as exemplified in FIGS. 2A and 2B, has an egg shaped exterior, the interval spacing 22 between the LEDs may have a wide arrangement. Moreover, since a plurality of drive electrode lines 23 exist to apply a voltage to the LEDs 21, the aforesaid problems remain.

Figure 3:
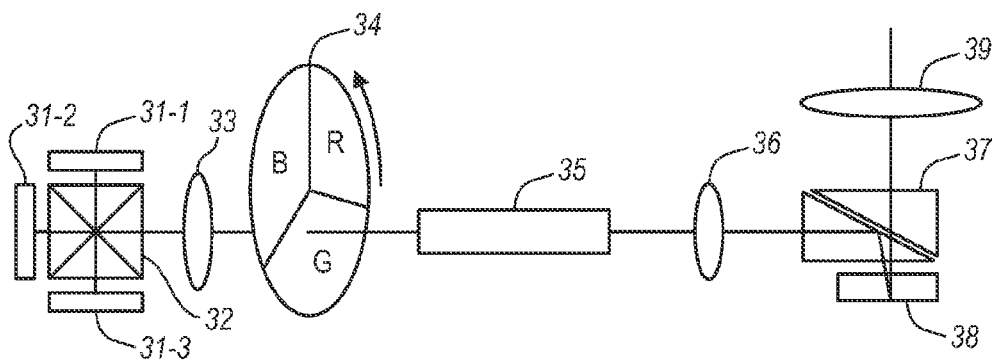
FIG. 3 is a diagram of a conventional single panel type DMD projector having a surface emitting light source applied thereto.

FIG. 3 is a diagram of a conventional single panel type DMD projector having a surface emitting light source applied thereto. The single panel type DMD projector having a surface emitting light source applied thereto consists of an R surface emitting light source 31-1, a G surface emitting light source 31-2, a B surface emitting light source 31-3, a synthesizing prism 32, a condenser lens 33, a color wheel 34, a rod lens 35, an illumination lens 36, a TIR prism 37, a DMD 38, and a projection lens 39.

The synthesizing prism 32 shown in FIG. 3 generates a white light by synthesizing R, G and B lights emitted from the R, G and B surface emitting light sources 31-1 to 31-3, respectively. The condenser lens 33 condenses the synthesized white light. The color wheel 34 rotates at high rotational speed to sequentially transmit the R, G and B lights. The rod lens 35 creates a uniform distribution of the light incident from the color wheel 34. The illumination lens 36 collects the light coming from the rod lens 35, and applies the light to the TIR prism 37. The TIR prism 37 totally reflects the light incident from the illumination lens 36, and the DMD 38 modulates the light reflected from the TIR prism 37 to create a color image signal. The color image created by the DMD 38 is transmitted through the TIR prism 37, and magnified by the projection lens 39. The magnified image is then projected to a screen (not shown in the drawing).

Reference will now be made in detail to exemplary embodiments of the present invention, and are illustrated in the accompanying drawings. Wherever possible, the same reference numbers will be used throughout the drawings to refer to the same or like parts.

In one embodiment of the present invention, a surface emitting light source is implemented with at least two semiconductor light emitting units. In this case, the at least two semiconductor light emitting units emit lights having different colors. A light emitted from the semiconductor light emitting unit(s) of the surface emitting light source propagates from the semiconductor light emitting units within a predetermined angle. The at least two semiconductor light emitting units are arranged in the same plane together so that a light can be emitted from the surface emitting light source with a uniform brightness distribution. According to the present invention, each of the semiconductor light emitting units can be implemented with an LED, a laser diode (LD), or the like.

According to one embodiment of the present invention, at least two of lights of at least two colors can be sequentially emitted from semiconductor light emitting units. For instance, assuming that the semiconductor light emitting units emit red, green and blue lights, respectively, the green, red or blue light is sequentially emitted from a surface emitting light source.

According to another embodiment of the present invention, at least two of lights of at least two colors can be simultaneously emitted from semiconductor light emitting units. For instance, assuming that the semiconductor light emitting units emit red, green and blue lights, respectively, one of white (W), magenta (M), cyan (C) and yellow (Y) lights can be emitted as well as the green, red or blue light from a surface emitting light source. Namely, when red, green and blue lights are simultaneously emitted from the semiconductor light emitting units, white light is emitted from the surface emitting light source. When red and blue lights are simultaneously emitted from the semiconductor light emitting units, magenta light is emitted from the surface emitting light source. When red and green lights are simultaneously emitted from the semiconductor light emitting units, yellow light is emitted from the surface emitting light source. When green and blue lights are simultaneously emitted from the semiconductor light emitting units, cyan light is emitted from the surface emitting light source.

Figure 4:
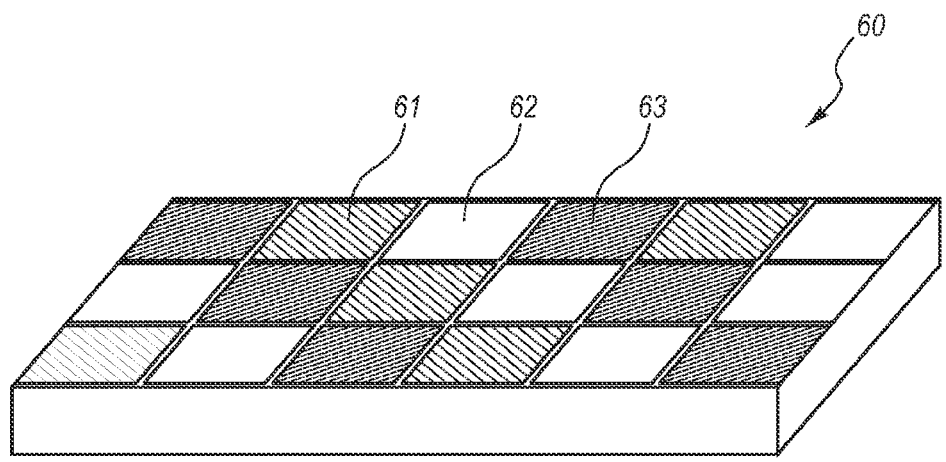
FIG. 4 is a perspective view of an exterior of a surface emitting light source according to one embodiment of the present invention.

FIG. 4 is a perspective view of an exterior of a surface emitting light source 60 according to one embodiment of the present invention.

Referring to FIG. 4, a surface emitting light source 60 according to one embodiment of the present invention includes semiconductor light emitting units 61, 62 and 63 emitting R, G and B lights, respectively.

Although the semiconductor light emitting units 61, 62 and 63 of the surface emitting light source of the present example are arranged in a checker board pattern, the semiconductor light emitting units can be arranged in various forms on a plane.

FIG. 5 is a schematic diagram of a semiconductor light emitting unit configured as a surface emitting light source according to one embodiment of the present invention.

Referring to FIG. 5, a semiconductor light emitting unit configured as a surface emitting light source according to the present invention includes a transparent substrate 71, a P-type semiconductor layer 72, an active layer 73, an N-type semiconductor layer 74, a transparent electrode 75, a reflective layer 76, an electric signal line 77, and a reflecting mirror 78-1 and 78-2.

The transparent substrate 71 is formed from a transparent material to enable the transmission of light. The P-type semiconductor layer 72 is stacked under the transparent substrate 71. The active layer 73 is stacked under a portion of a cut-out surface of the P-type semiconductor layer 72 for the emission of light. The N-type semiconductor layer 74 is stacked under the active layer 73. In this case, the height of the active layer 73 and the height of the N-type semiconductor layer 74 can be configured in a manner that the total height of the active layer 73 and the N-type semiconductor layer 74 are equal to a height (h) of the cut-out surface of the P-type semiconductor layer 72. The transparent electrode 75 includes a positive electrode and a negative electrode. The positive and negative electrodes are electrically connected to the P and N-type semiconductor layers 72 and 74, respectively.

In one embodiment, both the positive and negative electrodes are arranged in the same direction. By arranging the positive and negative electrodes in the same direction, the area occupied by the line 77 connected to the electrode is reduced to an area smaller than that of the line 23 connected to the drive electrode in the conventional surface emitting light source shown in FIG. 2. As the area occupied by the line is reduced, the size of the surface emitting light source according to the present invention can be reduced to a smaller size than that of conventional surface emitting light sources.

The reflective layer 76 is stacked under the positive and negative layers included in the transparent electrode 75. The reflective layer 76 includes the electric signal line 77 connected to the positive and negative electrodes and can be coated with a metal. Hence, if an electric signal from the electric signal line 77 is supplied to each of the P and N-type semiconductor layers 72 and 74, a voltage difference is generated between the P and N-type semiconductor layers 72 and 74. As a result of the generated voltage difference, light is emitted from the active layer 73.

The light emitted from the active layer 73 propagates toward the P-type semiconductor 72 and toward the N-type semiconductor 74. The light propagating in a direction toward the P-type semiconductor layer 72 is transmitted through the transparent substrate 71. The light propagating in a direction toward the N-type semiconductor layer 74 is transmitted through the transparent electrode 75, is reflected by the reflective layer 76, and is then transmitted through the transparent substrate 71. Hence, all of the light emitted from the active layer 73 ultimately propagates in a direction toward the transparent substrate 71.

The semiconductor light emitting unit also includes reflecting mirror 78-1 and 78-2. Optionally, reflecting mirrors 78-1 and 78-2 may be fabricated such that they are connected to each other. The reflecting mirrors can be mounted on the reflective layer 76.

The reflecting mirror 78-1 and 78-2 plays the role of reflecting light emitted from the semiconductor light emitting unit within a predetermined angle.

Since the reflecting mirror 78-1 and 78-2, as shown in FIG. 5, is mounted on the reflective layer 76, each of the semiconductor light emitting units of the surface emitting light source 60, shown in FIG. 4, may be configured to have a flat shape, whereas conventional semiconductor light emitting units of the surface emitting light source shown in FIG. 2 have an egg shape.

Figure 5A:
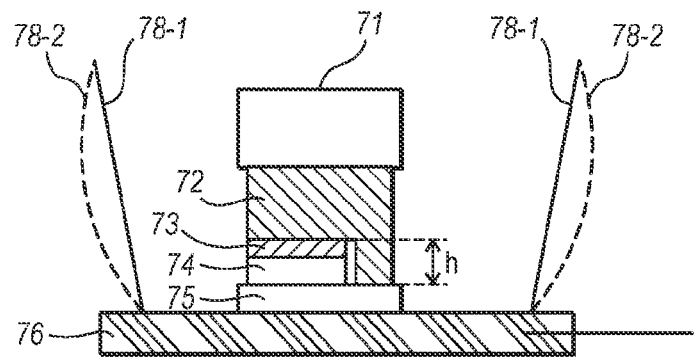
FIG. 5A-B are schematic diagrams of semiconductor light emitting units configured as surface emitting light sources according to some embodiments of the present invention.
Figure 5B:
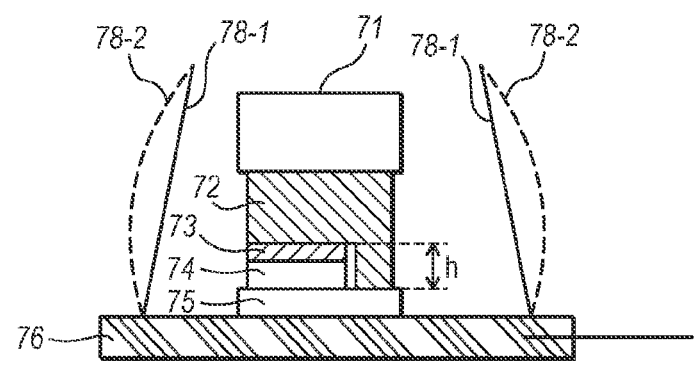

According to one embodiment of the present invention, and as illustrated in FIG. 5A, the reflecting mirror 78-1 is configured in a truncated cone shape, with a decreasing diameter toward the reflective layer 76. In other words, the diameter near the top of the reflecting mirror 78-1 (i.e., near the transparent substrate 71) is greater than the diameter near the reflective layer 76. Alternatively, according to another embodiment of the present invention, and as illustrated in FIG. 5B, the reflecting mirror is configured in a truncated cone shape, with an increasing diameter toward the reflective layer 76. In other words, the diameter near the top of the reflecting mirror 78-1 (i.e., near the transparent substrate 71) is less than the diameter near the reflective layer 76. Thus, an angle and output of the light emitted from the surface emitting light source 60 can be adjusted according to the angle of the reflecting mirror itself. Alternatively, the angle and output of the light emitted from the surface emitting light source 60 can be adjusted according to the shape of the reflecting mirror 78-1 and 78-2 connected to the reflective layer 76.

Alternatively, the surface emitting light source shown in FIG. 4 or FIG. 5 can have a chip shape.

A configuration and operation of a projection display device using the aforesaid surface emitting light source according to the present invention are explained with reference to the attached drawings as follows.

Figure 6:
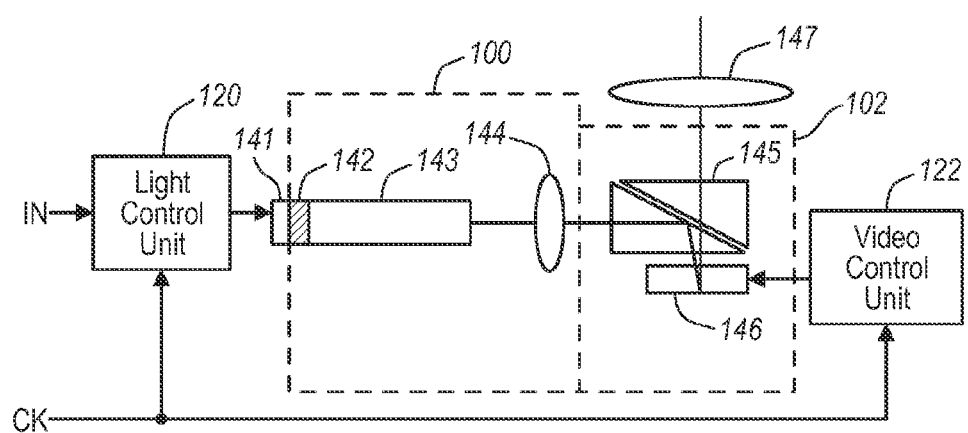
FIG. 6 is a schematic diagram of a projection display device using a surface emitting light source according to one embodiment of the present invention.

FIG. 6 is a diagram of a projection display device using a surface emitting light source according to one embodiment of the present invention.

Referring to FIG. 6, a projection display device using a surface emitting light source according to one embodiment of the present invention includes a surface emitting light source 141, a light illumination unit 100, a color image generating unit 102, and an optical projection unit 147.

The surface emitting light source 141 shown in FIG. 6 is identical to that shown in FIG. 4, and plays the same role. Namely, the surface emitting light source 141 can be implemented with at least two semiconductor light emitting units. The semiconductor light emitting units emit lights of at least two different colors, respectively. The surface emitting light source 141 causes the emitted light propagate externally within a predetermined angle. In the present embodiment, the at least two semiconductor light emitting units are arranged on the same plane. Each of the semiconductor light emitting units forming the surface emitting light source 141 can be configured as shown in FIG. 5.

The light illumination unit 100 creates a uniform brightness distribution of the light emitted from the surface emitting light source 141, and applies the uniform result the color image generating unit 102.

According to one embodiment of the present invention, the light illumination unit 100, as shown in FIG. 6, includes a diffraction lens (i.e., a diffractive optical element, or "DOE") 142, a rod lens 143, and an illumination lens 144.

The diffraction lens 142 condenses the light by reducing the radiation angle of the light emitted from the surface emitting light source 141 and then outputs the condensed result to the rod lens 143. In the present embodiment, the diffraction lens 142 can be provided in the vicinity of the surface emitting light source 141 and/or the rod lens 143. For instance, the diffraction lens 142, as shown in FIG. 6, can be configured to adhere closely to the surface emitting light source 141 and the rod lens 143. In this case, the light emitting area of the surface emitting light source 141 can be identical in dimension to the incident area of the rod lens 143.

The purpose of placing the diffraction lens 142 between the surface emitting light source 141 and the rod lens 143 is to reduce the radiation angle of the light emitted from the surface emitting light source 141. Otherwise, the radiation angle of the light emitted from the surface emitting light source 141 is to great to be used as an emitting source for DMD 146.

Because the diffraction lens 142 is generally used to reduce the radiation angle of the light emitted from the surface emitting light source 141, the precise dimensions and placement of the diffraction lens 142 should be determined. Moreover, as the distance from the surface emitting light source 141 to the diffraction lens 142 increases, the required cross-sectional area of the lens also increases. To minimize the required cross-sectional area of the diffraction lens 142, the diffraction lens 142 is placed between the surface emitting light source 141 and the rod lens 143 so that radiation angle of the light emitted from the surface emitting light source 141 is reduced. If the diffraction lens 142 is not provided, the radiation angle of the light emitted from the surface emitting light source 141 is not reduced. Consequently, the light incident on the DMD 146 via the rod lens 143 corresponds to only a portion of the entire light initially emitted from the surface emitting light source 141, thereby lowering the efficiency of the light emitted from the surface emitting light source 141.

The rod lens 143 creates a uniform brightness distribution of the light coming from the diffraction lens 142. The uniform result is output to the illumination lens 144. The illumination lens 144 collects the light coming from the rod lens 143 so that it can be applied to the color image generating unit 102.

According to another embodiment of the present invention, the light illumination unit 100, unlike that shown in FIG. 6, includes only the rod lens 143 and the illumination lens 144. In this case, the rod lens 143 creates a uniform brightness distribution of the light emitted from the surface emitting light source 141, and then outputs the uniformed result to the illumination lens 144.

The color image generating unit 102 modulates the light applied from the light illumination unit 100 to generate a color image that is output to the optical projection unit 147. To accomplish this, the color image generating unit 102 may include a total internal reflection (TIR) prism 145 and a digital micro-mirror device (DMD) 146. In this case, the TIR prism 145 totally reflects the light applied from the light illumination unit 100 and outputs the totally reflected result to the DMD 146. The TIR prism 145 includes a pair of prisms joined together, wherein an air gap is formed within the boundary between the two prisms. Because the light travels from the TIR prism 145, which has a relatively high refraction index, to the air gap, which has a relatively low refraction index, if the angle of incidence of the light is greater than a specific angle, total reflection takes place.

The DMD 146 modulates the light applied from the light illumination unit 100 to generate a color image and then outputs the generated color image to the optical projection unit 147 via the TIR prism 145.

The optical projection unit 147 enlarges the color image generated by the DMD 146 to project an image that can be displayed on a screen, or other display.

The process of condensing the light emitted from the rod lens 143 so that the light can be properly received by the DMD 146 is further explained with reference to FIG. 7. Because the TIR prism 145 merely plays the role of changing the direction of the light by total reflection, the TIR prism 145 is omitted for convenience of explanation.

Figure 7:
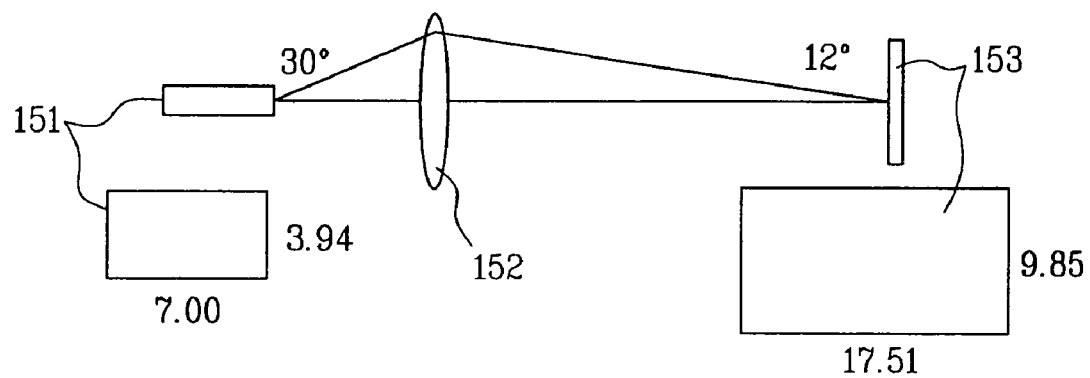
FIG. 7 is a diagram of a DMD and an illumination unit for illustrating the relation between size and magnification.

FIG. 7 is a diagram of a DMD 153 and a light illumination unit, including a rod lens 151 and illumination lens 152 for explaining a relation between size and magnification. The rod lens 151, illumination lens 152 and DMD 153 shown in FIG. 7 correspond to the rod lens 143, illumination lens 144 and DMD 146 shown in FIG. 6 and play the same roles, respectively.

Referring to FIG. 7, a light having a uniform light distribution is emitted from the rod lens 151 and is applied to the DMD 153 as a reflecting device via the illumination lens 152, which is configured with specific magnification. Due to the characteristics of the DMD 153, only light within ±12° of the light incident on the DMD 153 is used as a valid light.

If the size of the DMD 153 is fixed, a corresponding size of the rod lens 151 is determined by the magnification of the illumination lens 152. By way of example, if the size of the DMD 153 is 17.51 mm×9.85 mm and if the magnification of the illumination lens 152 is 2.5, the size of the rod lens 151 becomes 7.00 mm×3.94 mm.

The angle of the light coming from the rod lens 151 can be determined as well. Namely, if the magnification of the illumination lens 152 is 2.5, the angle of the light coming from the rod lens 151 becomes ±30°. Once the size of the DMD 153 and the angle of the incident light are determined, as the magnification of the illumination lens 152 is increased, the size of the rod lens 151 is decreased, and the angle of the light coming from the rod lens 151 is increased. Conversely, where the illumination lens 152 is configured to have a small magnification, the size of the rod lens 151 is increased and the angle of the light coming from the rod lens 151 is decreased. However, if the size of the rod lens 151 is increased, uniformity of the light is degraded since the number of irregular reflections of the incident light is decreased.

In accordance with the present invention, the projection display device shown in FIG. 6 can further include a light control unit 120 and a video control unit 122. The light control unit 120 controls the surface emitting light source 141 so that the light produced by the surface emitting light source 141 corresponds to an input image signal inputted via an input terminal IN, which is synchronized with a clock signal CK. For instance, where the surface emitting light source 141 is implemented to have the configuration shown in FIG. 4, the light control unit 120 controls the semiconductor light emitting units 61, 62 and 63 so that the light corresponding to the input image signal is synchronized with the clock signal CK, which is also applied to the diffraction lens 142.

The image control unit 122 controls the color image generating unit 102 to generate a color image. The light control unit 120 and the image control unit 122 of the projection device shown in FIG. 6 are synchronized with one another using the clock signal CK. This synchronization allows the surface emitting light source 141 to emit light having a color corresponding to a chrominance component of the color image generated from the DMD 146.

It is assumed that the semiconductor light emitting units implementing the surface emitting light source 141 emit red (R), green (G) and blue (B) lights, respectively. In this case, the light control unit 120 controls the surface emitting light source 141 so that the light having one of the red (R), green (G), blue (B), white (W), magenta (M), cyan (C) and yellow (Y) colors can be emitted from the surface emitting light source 141.

Figure 8:
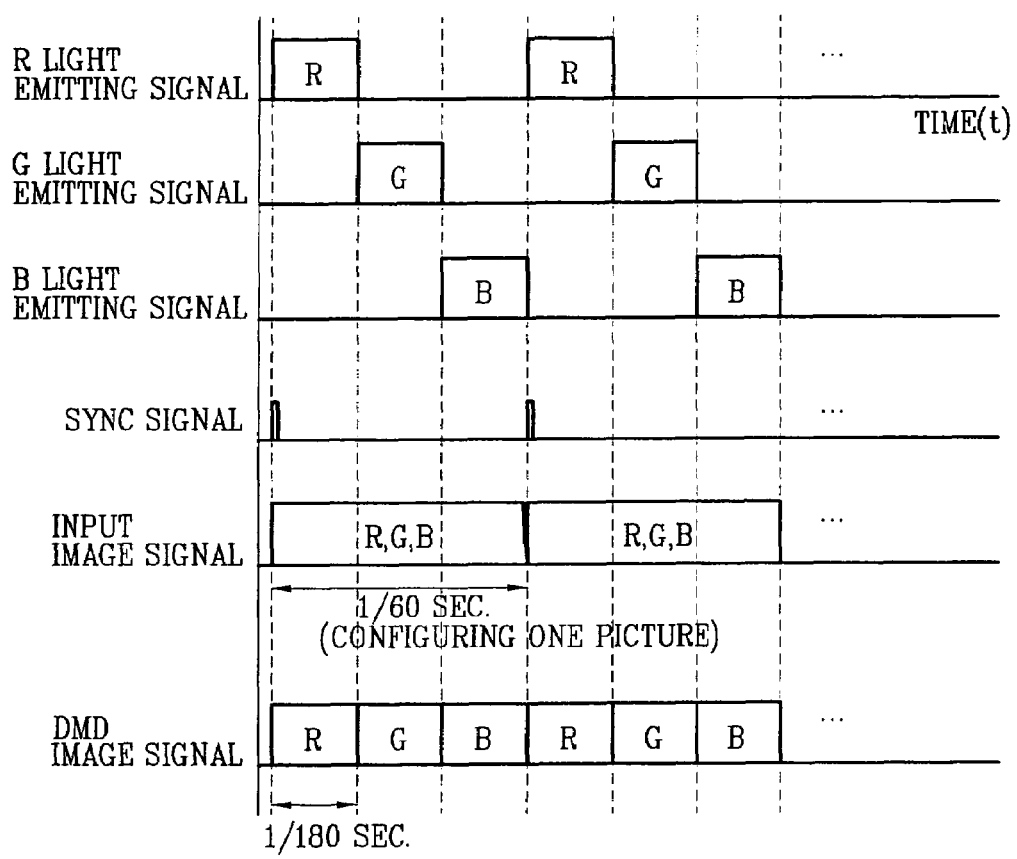
FIG. 8 is an exemplary graph of waveforms of the respective units of the device shown in FIG. 6.

FIG. 8 is an exemplary graph of waveforms of the respective components of the device shown in FIG. 6, in which R, G and B light emitting signals, a sync signal, an input image signal and DMD image signal are shown.

Referring to FIG. 8, if R, G and B components are included in the input image signal received at the input terminal IN, the light control unit 120 is synchronized with a sync signal generated in response to the clock signal CK. R, G and B light signals are generated sequentially, and are then sent to the surface emitting light source 141. In this case, since the R, G and B light emitting signals are applied to the electric signal lines 77 of the semiconductor light emitting units 61, 62 and 63 shown in FIGS. 4 and 6, each of the corresponding semiconductor light emitting units can emit the light of the appropriate color.

Hence, the surface emitting light source 141 can sequentially generate the light of the R, G and B colors by separating the light into three equal parts of R, G and B for a total of 1/60th of one second. One series of R, G and B colors comprises one picture frame, as indicated by the sync signal. The image control unit 122 is synchronized with the light control unit 120 by the sync signal generated in response to the clock signal CK. The image control unit 122 controls the color image generating unit 102, which generates the color image by repeating the R, G and B as shown in FIG. 8.

Figure 9:
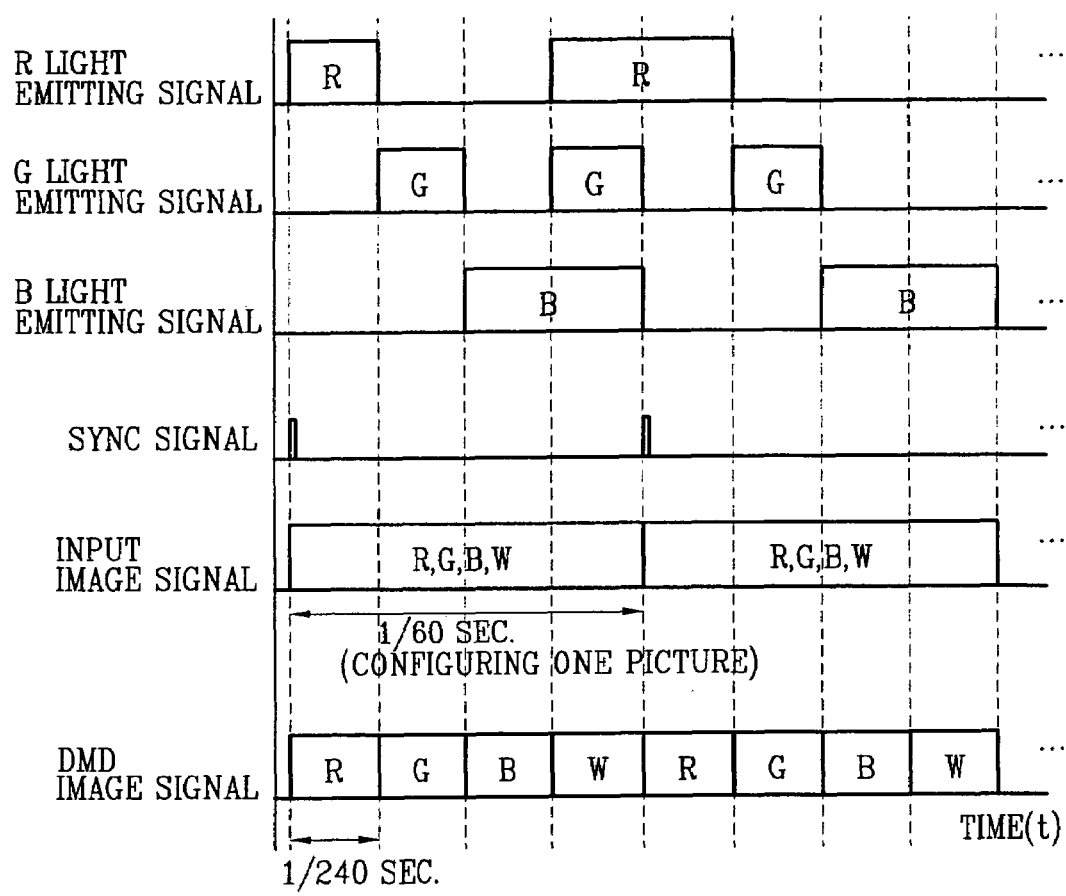
FIG. 9 is another exemplary graph of waveforms of the respective units of the device shown in FIG. 6.

FIG. 9 is another exemplary graph of waveforms of the respective components of the device shown in FIG. 6, in which R, G and B light emitting signals, a sync signal, an input image signal and a DMD image signal are shown.

Referring to FIG. 9, if R, G, B and W components are included in the input image signal received at the input terminal IN, the light control unit 120 is synchronized with a sync signal generated in response to the clock signal CK and generates R, G and B light emitting signals sequentially. In order for the surface emitting light source 141 to emit the light of white (W), the light control unit 120 simultaneously generates R, G and B light signals, which are applied to the surface emitting light source 120.

Hence, the surface emitting light source 141 can sequentially generate the light of the R, G, B and W colors by separating the light into four equal parts of R, G, B and W for a total of 1/60th of one second. One series of R, G, B and W comprises one picture frame, as indicated by the sync signal. The image control unit 122 is synchronized with the light control unit 120 by the sync signal generated in response to the clock signal CK. The image control unit 122 controls the color image generating unit 102, which generates the color image by repeating the R, G, B and W as shown in FIG. 9.

Figure 10:
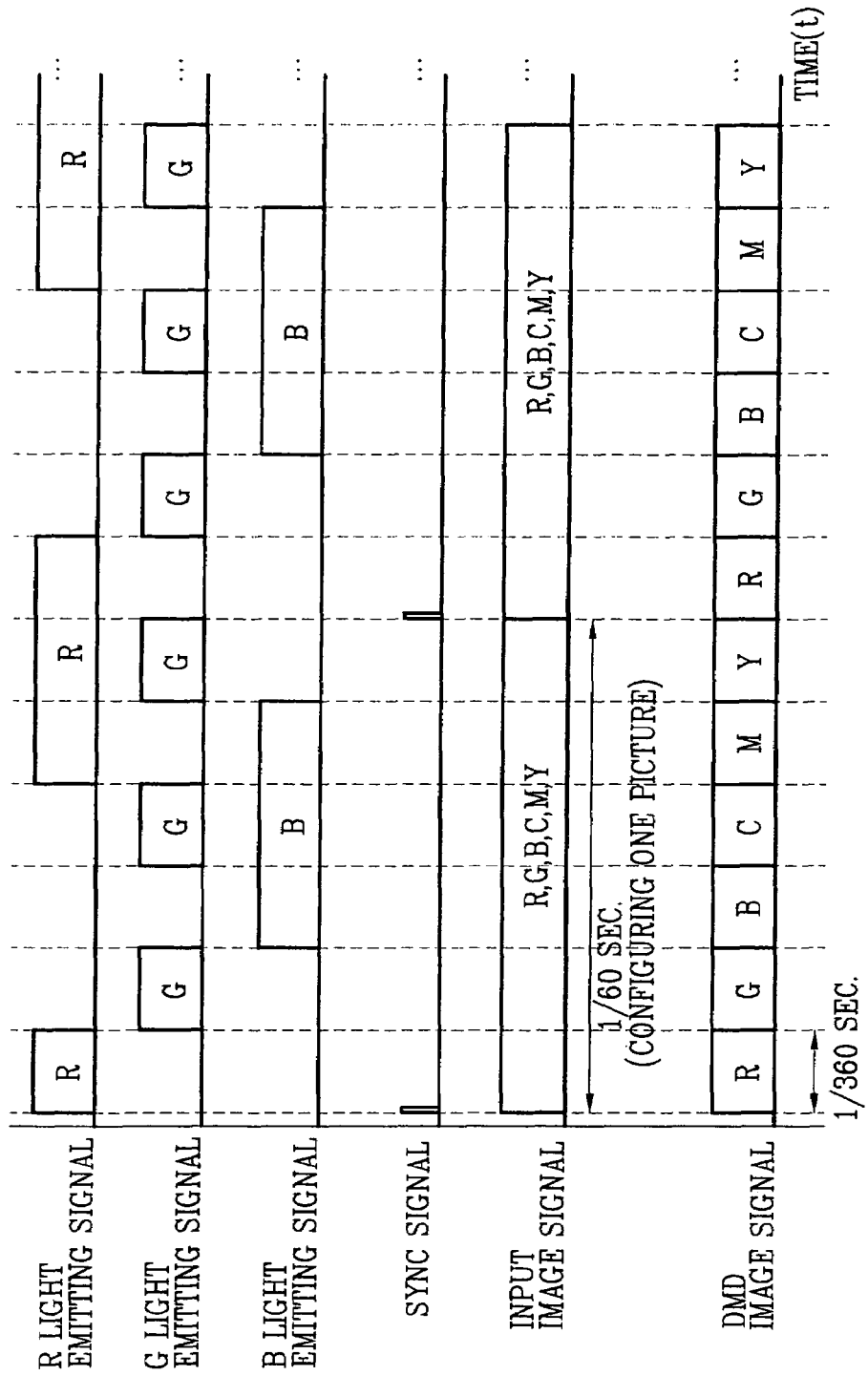
FIG. 10 is a further exemplary graph of waveforms of the respective units of the device shown in FIG. 6.

FIG. 10 is a further exemplary graph of waveforms of the components of the device shown in FIG. 6, in which R, G and B light emitting signals, a sync signal, an input image signal and a DMD image signal are shown.

Referring to FIG. 10, if R, G, B, C, M and Y components are included in the input image signal received at the input terminal IN, the light control unit 120 is synchronized with a sync signal generated in response to the clock signal CK. R, G and B light signals are emitted sequentially and are then sent to the surface emitting light source 141. In order for the surface emitting light source 141 to emit the light of cyan (C), the light control unit 120 simultaneously generates G and B light emitting signals to output to the surface emitting light source 141. In order for the surface emitting light source 141 to emit the light of magenta (M), the light control unit 120 simultaneously generates R and B light emitting signals to output to the surface emitting light source 141. In order for the surface emitting light source 141 to emit the light of yellow (Y), the light control unit 120 simultaneously generates G and R light emitting signals to output to the surface emitting light source 141.

Hence, the surface emitting light source 141 can sequentially generate the light of the R, G, B, C, M and Y colors by separating the light into six equal parts of R, G, B, C, M and Y for a total of 1/60 of one second. One series of R, G, B, C, M and Y comprises one picture frame, as indicated by the sync signal. The image control unit 122 is synchronized with the light control unit 120 by the sync signal generated in response to the clock signal CK. The image control unit 122 controls the color image generating unit 102, which generates the color image repeating the R, G, B, C, M and Y as shown in FIG. 10.

Accordingly, the present invention provides the following effects or advantages.

First, the light can be emitted in a specific direction desired by a user of the reflecting mirror.

Second, since the semiconductor light emitting units are configured to have the flat shape shown in FIG. 4 instead of having the egg shape shown in FIG. 2, the interval spacing between the semiconductor light emitting units can be reduced. Hence, by increasing the number of the semiconductor light emitting units integrated on a single area, i.e., by raising the degree of integration, the radiation intensity of the light outputted per unit area can be increased. Furthermore, the brightness distribution of the light emitted from the surface emitting light source can be made uniform.

Third, by joining the surface emitting light source to the diffraction and rod lenses, the size of the light illumination unit can be reduced.

Fourth, by removing the conventional mechanically driven color wheel, the present invention prevents noise from being generated, and, extends the life of the product.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A surface emitting light source, comprising:
a plurality of semiconductor light emitting units arranged on a single plane, the semiconductor light emitting units emitting lights of at least two different colors wherein the emitted lights are made to proceed externally within a predetermined angle,
wherein each of the plurality of semiconductor light emitting units comprises:
a light emitting diode, the light emitting diode including:
a transparent substrate:
a P-type semiconductor layer stacked below the transparent substrate;
an active layer stacked below a portion of a cut-out surface of the P-type semiconductor layer to emit light;
an N-type semiconductor layer stacked below the active layer;
a positive electrode and a negative electrode connected to the P and N-type semiconductor layers, respectively; and
a reflecting layer, the reflecting layer stacked below the positive and negative electrodes, including an electric signal line connected to the positive and negative electrodes;
a reflecting mirror mounted on the reflecting layer of the light emitting diode, reflecting the light emitted from the light emitting diode within the predetermined angle.

2. The surface emitting light source of claim 1, wherein the lights of the at least two different colors are sequentially emitted from the plurality of semiconductor light emitting units.

3. The surface emitting light source of claim 1, wherein at least two of the lights of the at least two different colors are simultaneously emitted from the plurality of semiconductor light emitting units.

4. The surface emitting light source of claim 1, wherein the plurality of semiconductor light emitting units are arranged in a checker board form on the plane.

5. The surface emitting light source of claim 1, wherein each of the plurality of semiconductor light emitting units is configured to have a flat shape.

6. The surface emitting light source of claim 1, wherein the reflecting mirrors of each of the plurality of semiconductor light emitting units are connected to one another.

7. The surface emitting light source of claim 1, wherein the reflecting mirror is provided on the reflecting layer to enclose the corresponding semiconductor light emitting unit in a truncated cone form having a diameter decreasing toward the reflecting layer.

8. The surface emitting light source of claim 1, wherein the reflecting mirror is provided on the reflecting layer to enclose the corresponding semiconductor light emitting unit in a truncated cone form having a diameter increasing toward the reflecting layer.

9. The surface light emitting source of claim 2 or claim 3, wherein the plurality of the semiconductor light emitting units emits red, green and blue lights, respectively and wherein a color of the light proceeding externally from the surface emitting light source corresponds to one selected from the group consisting of red, green, blue, white, magenta, cyan and yellow.

10. A projection display device comprising:
a surface emitting light source having a plurality of semiconductor light emitting units arranged on a single plane, the semiconductor light emitting units emitting lights of at least two different colors wherein the emitted lights are made to proceed externally within a predetermined angle;
a light illumination unit for creating a uniform brightness distribution of the light proceeding externally from the surface emitting light source;
a color image generating unit modulating light applied from the light illumination unit to generate a color image; and
an optical projection unit for enlarging and projecting the color image generated from the color image generating unit,
wherein each of the plurality of semiconductor light emitting units comprises:
a light emitting diode including:
a transparent substrate;
a P-type semiconductor layer stacked below the transparent substrate;
an active layer stacked below a portion of a cut-out surface of the P-type semiconductor layer to emit light; an N-type semiconductor layer stacked below the active layer:
a positive electrode and a negative electrode connected to the P and N-type semiconductor layers, respectively; and
a reflecting layer, wherein the reflecting layer includes electric lines that are connected to the positive and negative electrodes of the light emitting diode, and wherein the reflecting layer is stacked below the positive and negative electrodes; and
a reflecting mirror mounted on the reflecting layer of the light emitting diode, reflecting the light emitted from the light emitting diode within the predetermined angle.

11. The projection display device of claim 10, further comprising:

an image control unit for controlling the color image generating unit and for synchronizing the color image with a clock signal; and a light control unit for controlling the surface emitting light source so that the light corresponding to an input image signal is synchronized with the clock signal.

12. The projection display device of claim 11, wherein the light control unit causes the surface emitting light source to emit light having one color selected from the group consisting of red, green, blue, white, magenta, cyan and yellow, and wherein the plurality of semiconductor light emitting units emits red, green and blue lights.

13. The projection display device of claim 10, the light illumination unit comprising:

a rod lens for creating a uniform brightness distribution of the light proceeding externally from the surface emitting light source; and an illumination lens for collecting the light coming from the rod lens and for applying the light coming from the rod lens to the color image generating unit.

14. The projection display device of claim 13, the light illumination unit further comprising a diffraction lens for condensing and reducing a radiation angle of the lights proceeding externally from the surface emitting light source, and wherein the rod lens creates a uniform brightness distribution of the light coming from the diffraction lens.

15. The projection display device of claim 14, wherein the diffraction lens is provided in close proximity to the surface emitting light source.

16. The projection display device of claim 14, wherein the diffraction lens is provided in close proximity to the rod lens.

17. The projection display device of claim 10, the color image generating unit comprising:

a total internal reflection prism for totally reflecting the light applied from the light illumination unit; and a digital micro-mirror device modulating the light reflected from the total internal reflection prism to generate the color image.

* * * * *